United States Patent [19]

Prater

[11] Patent Number: 4,553,051

[45] Date of Patent: Nov. 12, 1985

[54] PMOS INPUT BUFFER COMPATIBLE WITH LOGIC INPUTS FROM AN NMOS MICROPROCESSOR

[75] Inventor: Cordell E. Prater, Johnson City, Tenn.

[73] Assignee: Texas Instruments Incorporated, Dallas, Tex.

[21] Appl. No.: 514,431

[22] Filed: Jul. 18, 1983

[51] Int. Cl.$^4$ .................. H03K 19/094; H03K 3/037; H03K 3/356

[52] U.S. Cl. .................................... 307/475; 307/270; 307/279

[58] Field of Search ............... 307/475, 446, 450, 270, 307/279, 290

[56] References Cited

U.S. PATENT DOCUMENTS

| | | | |
|---|---|---|---|
| 4,000,411 | 12/1976 | Sano et al. | 307/475 |
| 4,023,050 | 5/1977 | Fox et al. | 307/264 |
| 4,031,409 | 6/1977 | Shimada et al. | 307/475 |
| 4,300,213 | 11/1981 | Tanimura et al. | 307/475 X |

FOREIGN PATENT DOCUMENTS

| | | | |
|---|---|---|---|
| 143991 | 9/1980 | Fed. Rep. of Germany | 307/475 |
| 54-561 | 4/1979 | Japan | 307/475 |
| 93731 | 10/1982 | Japan | 307/475 |

OTHER PUBLICATIONS

Harroun, "Alterable Level Converting Circuit", *IBM Tech. Discl. Bull.*; vol. 22, No. 8B; pp. 3638–3640; 1/1980.

*Primary Examiner*—Larry N. Anagnos
*Attorney, Agent, or Firm*—James P. McAndrews; John A. Haug; Melvin Sharp

[57] ABSTRACT

A PMOS input buffer compatible with logic voltage levels provided by NMOS or TTL microprocessor means uses a limited number of transistors of limited size for driving a load in response to such logic and is adapted for use under widely varying operating conditions.

6 Claims, 2 Drawing Figures

4,553,051

PMOS INPUT BUFFER COMPATIBLE WITH LOGIC INPUTS FROM AN NMOS MICROPROCESSOR

BACKGROUND OF THE INVENTION

The field of this invention is that of metal-oxide-semiconductor (MOS) integrated circuits, and the invention relates more particularly to an improved MOS input buffer for use in such a circuit.

Microprocessors implemented in NMOS integrated circuit technology are typically proposed for use in automotive control applications to meet the speed, complexity and cost requirements of such applications. However the LED or vacuum fluorescent display means and PMOS display driver means which are usually proposed for use in such automotive applications to meet the requirements of cost and sunlight conditions and the like have input requirements which are typically not compatible with the voltage levels of the logic signals provided by such NMOS microprocessor means. That is, conventional input buffer means are not adapted for use between the NMOS microprocessor and the associated PMOS circuit means. For example, the input signals provided by the NMOS microprocessor are referenced to the drain supply voltage so that a conventional input buffer utilizing a grounded source enhancement device and a saturated load with the Beta ratio adjusted for input voltage levels is found to be inappropriate. Similarly, known input buffer means utilizing differential amplifier means are found to provide very little gain and are also considered inappropriate. Accordingly relatively expensive CMOS buffer means and the like have been proposed for use to permit the preferred microprocessor, display, and driver means to be employed together in automotive control applications.

SUMMARY OF THE INVENTION

It is an object of this invention to provide a novel and improved integrated circuit means for use between NMOS integrated circuit means and cooperating integrated circuit means implemented in other than NMOS circuit technology; to provide a novel and improved input buffer for use between NMOS microprocessor means and integrated circuit means including PMOS display driver means and the like; and to provide an improved input buffer compatible with logic inputs from NMOS and TTL microprocessor means which is characterized by low cost, by the use of a limited number of transistor means of relatively limited size, and by being adapted for use under the widely varying operating conditions typically associated with automotive control applications and the like.

Briefly described, the novel and improved integrated circuit of this invention comprises input buffer means implemented in PMOS integrated circuit technology to be compatible with the output voltage levels of logic signals provided by NMOS microprocessor means. The improved PMOS input buffer includes level-shifting means responsive to the logic signals provided by the NMOS microprocessor means for providing corresponding logic signals at substantially improved voltage levels. Preferably the level shifting means are selected to be dependent on the level of the drain supply voltage provided in the input buffer for assuring that the desired level shifting is achieved during variations in drain supply voltage under widely varying operating conditions such as might be encountered in automotive control applications. The improved input buffer further includes Schmitt trigger means arranged to be responsive to the levelshifted input signals to provide desired hysteresis for improving noise suppression in the buffer. Preferably the Schmitt trigger means are arranged so that the thresholds of the trigger track the outputs of the level shifting means over the range of variation in the drain supply voltage of the buffer system. In the preferred embodiment of the invention, the output stages of the buffer include source follower means and the Schmitt trigger is arranged to be driven by the source follower means for achieving further improved speed characteristics in the buffer. The source follower means also serves to provide current gain and improved level shifting and in the preferred embodiment of this invention, the input buffer further includes an otherwise conventional push-pull output stage for achieving further desired current gain.

DESCRIPTION OF THE DRAWINGS

Other objects, advantages and details of the novel and improved input buffer of this invention appear in the following detailed description of preferred embodiments of the invention, the detailed description referring to the drawings in which.

DESCRIPTION OF THE PREFERRED EMBODIMENTS

Figure 1:
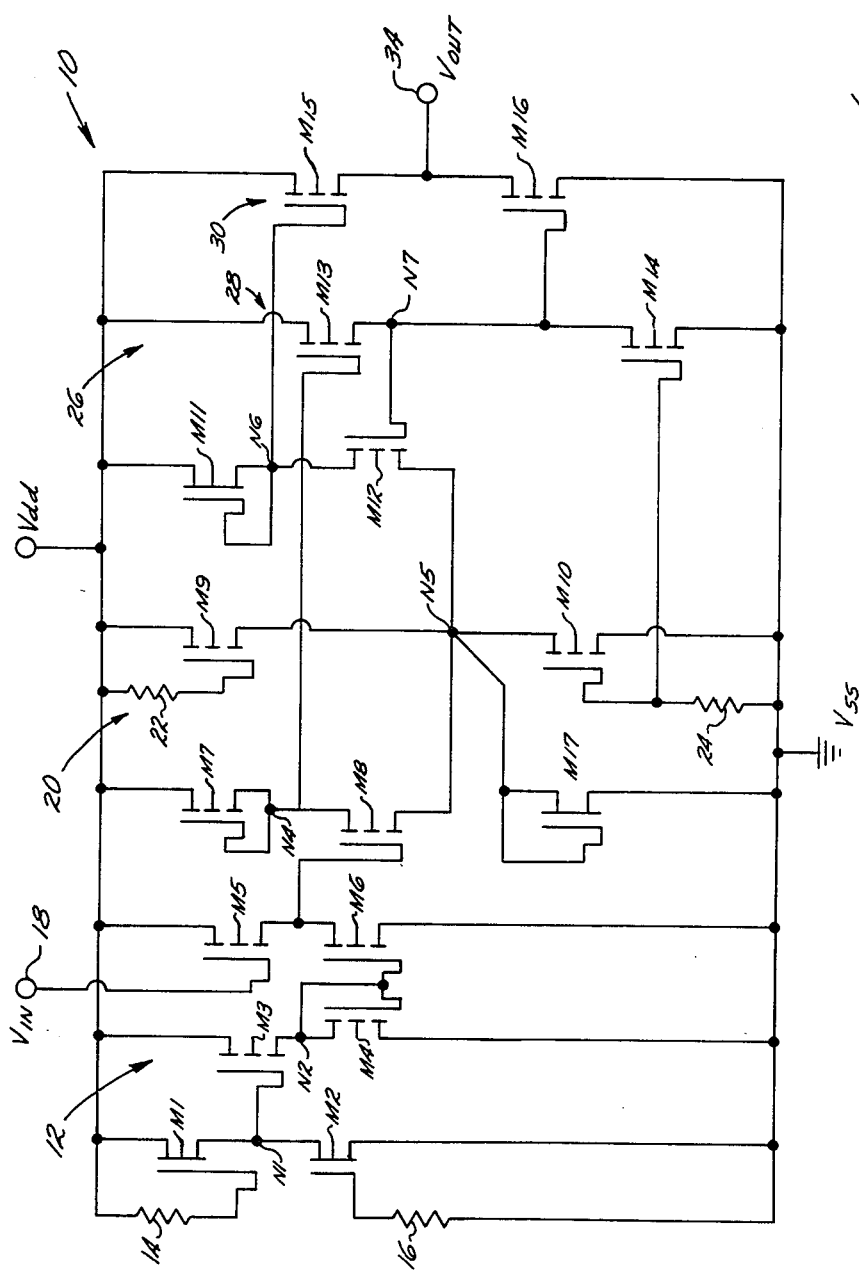
FIG. 1 is a schematic circuit diagram of a PMOS input buffer provided by this invention.

Referring to the drawings, the novel and improved MOS integrated circuit of this invention is shown to comprise an input buffer 10 having voltage level shifting means 12 incorporated MOS transistors $M_1$–$M_6$. All PMOS transistors are illustrated in FIG. 1 but it should be understood that other circuit components can also be incorporated in the improved input buffer 10 within the scope of this invention. The channels of the transistors $M_2$ and $M_1$ are connected in series between the source and drain supply voltages $V_{ss}$ and $V_{dd}$. In the preferred embodiment, both transistors are depletion-type devices which are always on and the drain of transistor $M_2$ is connected to the source of transistor $M_1$ to form the node $N_1$ as illustrated in FIG. 1. The gates of transistors $M_1$ and $M_2$ are connected to the drain supply voltage and to the source supply voltage respectively, preferably through respective current limiting resistors 14 and 16 which serve to protect the input buffer against static electricity. The transistor $M_1$ is operated in the triode region to serve as a resistor and transistor $M_2$ is always saturated to serve as a current source.

The channels of transistors $M_4$ and $M_3$ are also connected in series between the source and drain supply voltages. The gate of transistor $M_3$ is connected to node $N_1$. The drain of transistor $M_4$ is connected to the source of transistor $M_3$ to form the node $N_2$ as shown in FIG. 1 and that node $N_2$ is connected to the gate of transistor $M_4$. Both of the transistors $M_3$ and $M_4$ are enhancement-type devices and are proportioned and arranged so that they are always on to provide a relatively limited level of current. The channels of transistors $M_6$ and $M_5$ are also connected in series between the source and drain supply voltages, both of those transistors being enhancement-type devices. The gate of transistor $M_5$ is connected to the input 18 of the buffer which is typically provided by an NMOS microprocessor or a transistor-transistor-logic (TTL) circuit or the like. The gate of the transistor $M_6$ is connected to the node $N_2$ in common with the gate of transistor $M_4$ so that transistors $M_4$ and $M_6$ form a current mirror. The drain of transistor $M_6$ is connected to the source of transistor $M_5$ to form node $N_3$ as is shown in FIG. 1. Transistors $M_3$–$M_6$ all operate in the saturation region.

In accordance with this invention, the level shifting means 12 cooperates with Schmitt trigger means 20 comprising the PMOS transistors $M_7$–$M_{12}$ and $M_{17}$ which provides the input buffer 10 with desired hysteresis. That is, the channels of transistors $M_{10}$ and $M_9$ are connected in series between the source and drain supply voltages as shown in FIG. 1. The gates of the transistors $M_9$ and $M_{10}$ are connected to the drain and source supply voltages respectively, preferably through a respective current limiting resistors 22 and 24 for protecting the input buffer against static electricity. The transistor $M_9$ is an enhancement-type device and transistors $M_{10}$ and are depletion-type devices and the drain of $M_{10}$ is connected to the source of $M_9$ to form the node $N_5$. Transistor $M_{17}$ has its drain and gate connected to node $N_5$ and its source connected to $V_{ss}$. The channels of transistors $M_7$ and $M_8$ are connected in series between the drain supply voltage $V_{dd}$ and node $N_5$ and the channels of transistors $M_{11}$ and $M_{12}$ are also connected in series between the drain supply voltage and node $N_5$. Transistor $M_7$ has its gate connected to its source and is also connected to the drain of transistor $M_8$ to form node $N_4$. The gate of transistor $M_8$ is connected to node $N_3$. Transistor $M_{11}$ has its gate connected to its source and is also connected to the drain of transistor $M_{12}$ to form node $N_6$. The transistors $M_7$, $M_{10}$, $M_{11}$ and $M_{17}$ are depletion-type devices while transistors $M_8$, $M_9$ and $M_{12}$ are enhancement devices. Transistors $M_7$ and $M_{11}$ are saturated while transistor $M_{10}$ and $M_{17}$ operate in the linear region.

In accordance with this invention, the input buffer 10 further includes the driver means 26 which preferably includes source follower, buffer means 28 comprising the transistors $M_{13}$ and $M_{14}$. The driver also includes an output stage 30 comprising the transistors $M_{15}$ and $M_{16}$. Preferably, the channels of transistors $M_{14}$ and $M_{13}$ are connected in series between the source and drain supply voltages. The drain of depletion device $M_{14}$ is connected to the source of enhancement device $M_{13}$ to form the node $N_7$ which is connected in common to the gate of transistor $M_{12}$ in the Schmitt trigger 20. The gate of transistor $M_{14}$ is connected to the source supply voltage, preferably through the static protection resistor 24 and the gate of transistor $M_{13}$ is connected to node $N_4$ in the Schmitt trigger. The two enhancement-type transistors $M_{16}$ and $M_{15}$ are connected in push-pull configuration between the source and drain supply voltages and the drain of transistor $M_{16}$ is connected to the source of transistor $M_{15}$ to form the output 34 of the buffer 10. The gate of transistor $M_{16}$ is connected to the node $N_7$ and the gate of transistor $M_{15}$ is connected to the node $N_6$ in the Schmitt trigger 20.

As thus far described, the input buffer 10 is preferably arranged in an integrated circuit to receive logic signals from an NMOS microprocessor or the like. In a preferred embodiment of the invention where the buffer is used for driving PMOS circuit means including LED or vacuum fluorescent display means in an automotive control application for example, the source supply voltage $V_{ss}$ corresponds to the vehicle supply voltage and typically varies from $-8$ to $-18$ volts over an ambient temperature ($t_a$) range of $-30°$ C. to $85°$ C. and is typically about 9.5 v. The drain supply voltage $V_{dd}$ corresponds to system ground. In that arrangement, voltages at input 18 representing logic inputs "0" and "1" will be within a short range of $V_{dd}$, typically in a range from $V_{dd}+0.8$ v. to $V_{dd}+3.5$ v. and neither input will approach $V_{ss}$.

In one preferred embodiment of the invention, the PMOS transistors $M_1$–$M_{17}$ have widths and lengths (W/L) in mils as set forth in Table I below:

TABLE I

| Transistor | W/L | Transistor | W/L |
|---|---|---|---|
| $M_1$ | .3/1.0 | $M_9$ | .3/2.4 |
| $M_2$ | .3/.60 | $M_{10}$ | .7/.6 |
| $M_3$ | .3/1.0 | $M_{11}$ | .35/.6 |
| $M_4$ | 18.0/.60 | $M_{12}$ | 3.4/.3 |
| $M_5$ | .3/1.0 | $M_{13}$ | 1.2/.3 |
| $M_6$ | 18.0/.60 | $M_{14}$ | .3/1.0 |
| $M_7$ | .3/1.0 | $M_{15}$ | 1.0/.3 |
| $M_8$ | 1.4/.3 | $M_{16}$ | 1.0/.3 |
|  |  | $M_{17}$ | .7/.6 |

With those characteristics, the input buffer 10 has the following input specifications:

|  | Min. | Max. |
|---|---|---|
| (1) $V_{ss}$ | 8 volts | 18 volts |
| (2) $t_a$ | $-30°$ C. | $85°$ C. |
| (3) $V_{IH}$ | 3.5 volts | $V_{ss}$ plus .3 volts |
| (4) $V_{IL}$ | $-.3$ volts | .8 volts |
| (5) Hysteresis | .5 volts | .8 volts |

(voltages stated with respect to $V_{dd}$)

That is, where the source supply voltage varies from 8 to 18 volts, the input buffer is adapted to be responsive to logic high input voltages varying from 3.5 volts to $V_{ss}+0.3$ volts and to logic low input voltages varying from $-0.3$ volts to 0.8 volts while providing desired hysteresis of 0.5 volts.

Figure 2:
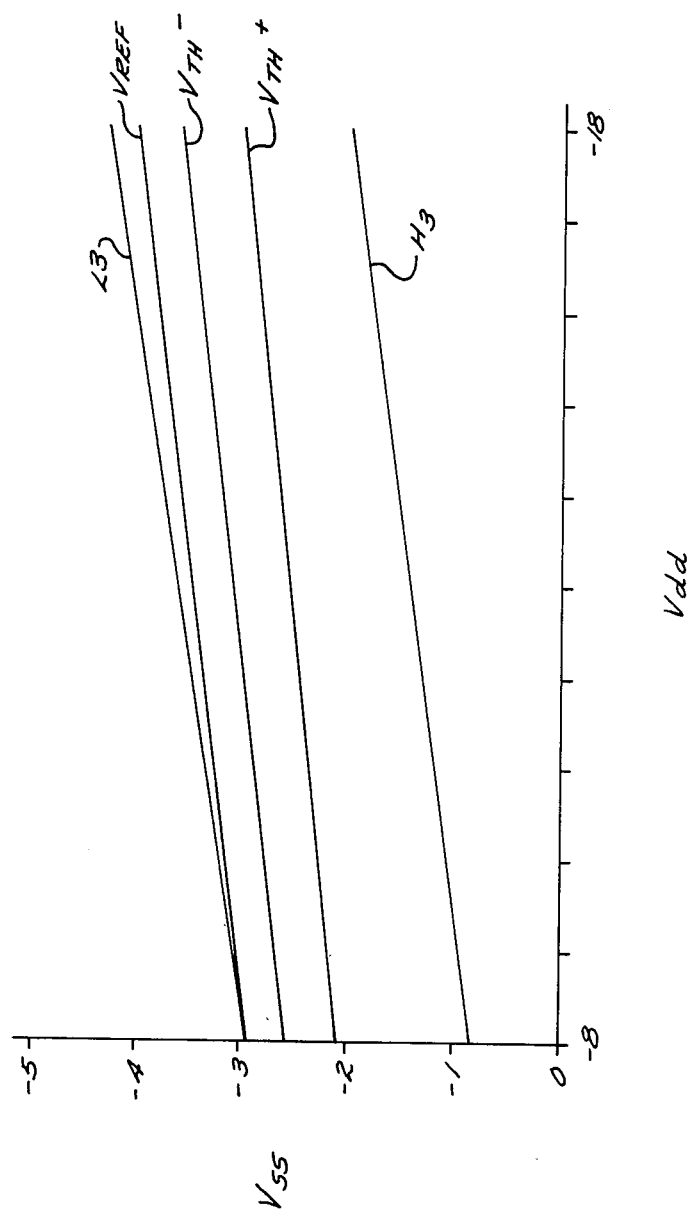
FIG. 2 is a graph illustrating operating characteristics of the input buffer of FIG. 1.

As thus described, the buffer 10 provides level shifting, voltage and current gain, and desired hysteresis corresponding to the input specification as set forth above. In the level-shifting means 12, the transistor $M_2$ is always saturated and serves as a current source while the transistor $M_1$ operates in the triode region and serves as a resistor, whereby a constant reference voltage $V_{REF}$ is generated at node $N_1$, that voltage being referenced to $V_{ss}$. The voltage $V_{REF}$ corresponds generally to the drain to source voltage across transistor $M_1$ and varies with $V_{ss}$ such that as $V_{ss}$ varies between $-8$ and $-18$ volts, the reference voltage $V_{REF}$ varies between 3 volts and 4 volts. That voltage at $N_1$ then serves to set the gate voltage at transistor $M_3$ to provide the desired voltage level shifting. That is, the current $I_{M3}$ in transistor $M_3$ equals current $I_{M4}$ in transistor $M_4$; the current $I_{M5}$ in transistor $M_5$ equals current $I_{M6}$ in transistor $M_6$; the current $I_{M4}$ equals the current $I_{M6}$; and the voltage at node $N_2$ corresponds to the threshold voltage $V_T$ of transistor $M_4$. The voltage at node $N_3$ therefore corresponds generally to the input voltage at 18 less the reference voltage $V_{REF}$ plus the noted threshold voltage $V_T$. The transistors $M_3$–$M_6$ all operate in the saturation region since their gate voltages never exceed the drain supply voltage $V_{dd}$. In that arrangement, where the reference voltage $V_{REF}$ is set to correspond to $V_{IH}$, at 3.5 volts as set out in specification (3), the gate voltages provided at node N₃ have logic levels of $V_T$ and $V_T+(V_{IH}(min.)-V_{IL}(max.))$ which is ideal to drive the Schmitt trigger stage of the buffer as is illustrated in FIG. 2. That is, the low and high logic voltage levels L₃ and H₃ appearing at node N₃ as voltages $V_{IL}$ 0.8 volts) and $V_{IH}$ (3.5 volts) are applied at the input 18 respectively result in a minimum output of the level shifting means 12 as indicated by curves L₃ and H₃ in FIG. 2 as the drain supply voltage $V_{dd}$ varies between −8 and −18 volts.

In accordance with this invention, the Schmitt trigger means 20 is further adapted to cooperate with the level-shifting means 12 to assure proper operation of the buffer 10 over a wide range of operating conditions. Thus the thresholds $V_{TH}+$ and $V_{TH}-$ of the Schmitt trigger are described by the following expressions:

(1) $V_{TH}+ \cong (I_{M7}+I_{M11})R+V_{TM8}$; and (2) $V_{TH}- \cong I_{M7}R+V_{TM8}$ where $I_{M7}$, $I_{M10}$ and $I_{M11}$ are the currents in transistors M₇, M₁₀ and M₁₁ respectively, R is a resistance across the parallel combination of transistors M₁₀ and M₁₇, and $V_{TM8}$ is the threshold voltage of transistor M₈. In that regard, the transistors M₇ and M₁₁, are saturated and transistors M₁₀ and M₁₇ operate in the linear region. The hysteresis provided by the Schmitt trigger corresponds to $I_{M11}R$.

In that arrangement, transistors M₇ and M₈ form a first leg of the Schmitt trigger and transistors M₁₁ and M₁₂ form the second or alternate leg of the trigger which cooperate with transistors M₁₀ and M₁₇ to provide the trigger with selected hysteresis. The transistor M₉ then acts as a resistor to the drain supply voltage and adds some dependence on drain supply voltage to both of the thresholds of the Schmitt trigger without affecting the hysteresis provided by the Schmitt trigger for noise suppression purposes. In that way, the Schmitt trigger compensates to some extent for the $V_{dd}$ dependence of the voltage at node N₁ (due to the body effect of transistors M₁ and M₅) as previously described. As a result, the thresholds of the Schmitt trigger in the buffer 10 track the output of the level shifting means 12 over the range of variation of the drain supply voltage as is indicated at $V_{TH}+$ and $V_{TH}-$ in FIG. 2.

The final output stage 26 of the buffer 10 then cooperates with the Schmitt trigger 20 in providing desired output voltage and drive current capabilities as will be understood. That is, the transistors M₁₃ and M₁₄ serve as a source follower to provide current gain and some additional shift of voltage level at node N₇. The fairly large transistor M₁₂ in the Schmitt trigger is then driven by the source follower as illustrated in FIG. 1 to improve the propogation delay achieved by the Schmitt trigger. The transistors M₁₅ and M₁₆ are arranged in push-pull configuration as shown and comprise a conventional buffer output stage.

As thus described, the buffer 10 provides A.C. propagation delay ($V_{IN}$ to $V_{OUT}$) as illustrated in Table II:

TABLE II

| Condition | Output Transition | $V_{ss} = -8$ v. 1→0 | 0→1 | $V_{ss} = -18$ v. 1→0 | 0→1 |
|---|---|---|---|---|---|
| Typical | | 295 | 195 | 335 | 235 |
| Worst Case | | 655 | 715 | 575 | 475 |

The data is given in nanoseconds for operation at 120° C. in both cases for the case where 1=$V_{ss}$ and 0=$V_{dd}$.

In use, the buffer 10 typically receives a logic input from an NMOS microprocessor or the like so that the input voltage $V_{IN}$ at 18 varies within a short range of the drain supply voltage $V_{dd}$ and does not approach the level of the source supply voltage $V_{ss}$. The buffer 10 is compatible with such an input from the microprocessor and serves as a noninverting input buffer to provide desired voltage and current levels for driving circuits including PMOS display driver means and the like in automotive applications.

In that regard, transistors M₁ and M₂ are always on and serve as a voltage divider to provide a reference voltage $V_{REF}$ at node N₁. That reference voltage varies in the range from 3 volts to 4 volts as the drain supply voltage $V_{ss}$ varies from −8 to −18 volts and the voltage at N₁ biases the level shifting components M₃–M₆ to provide desirably level-shifted voltages at node N₃. That is, the transistor M₃ has the same size and resistance as transistor M₅ and transistor M₄ has the same size and resistance as transistor M₆. Transistors M₄ and M₆ form a current mirror. Transistor M₃ is biased by reference voltage $V_{REF}$ and serves as a voltage-to-current converter tending to provide a desired current level in transistor M₄ and therefore in transistor M₆. In that arrangement, as the input voltage $V_{IN}$ varies as above described, the voltage across transistor M₅ corresponds to the voltage across transistor M₃ and produces a desired level-shifting of the low and high voltages at node N₃ away from $V_{dd}$ toward $V_{ss}$ as is indicated by curves L₃ and H₃ in FIG. 2. Those voltage levels at N₃ then cooperate with the Schmitt trigger 20 and with the driver means 26 to provide an output 34 at desired voltage and current levels and with desired hysteresis for noise suppression purposes for driving the noted automotive control circuit.

For example, when the input voltage $V_{IN}$ at 18 is high corresponding to a logic input "1" nearer to $V_{ss}$, the voltage at node N₃ corresponds to curve H₃ in FIG. 2 so that the transistor M₈ is turned off. When M₈ turns off, the voltage at N₄ moves toward the level of the drain supply voltage $V_{dd}$. Transistors M₁₃ and M₁₄ form a source follower and as the voltage at N₄ goes toward $V_{dd}$, transistor M₁₃ conducts and the voltage at node N₇ also goes close to $V_{dd}$ (near logic "0"). Transistor M₁₆ is therefore turned on and the voltage at output 34 also goes high nearer to $V_{ss}$.

The transistors M₉ and M₁₀ are always on in the Schmitt trigger 20 and the transistor M₁₀ operates in the triode region to function as a resistor. There is accordingly a small current flowing in transistors M₉ and M₁₀ and M₉ applies a selected voltage bias to node N₅. Before transistor M₈ is turned off as noted above, a small current also flows in transistor M₇ and M₈ providing additional voltage at the node N₅ as will be understood. Then, when transistor M₁₂ is turned on as noted above, transistor M₁₁ has slightly less resistance than transistor M₇ and provides a positive feedback so that the voltage at node N₅ goes slightly toward $V_{dd}$, thereby turning transistor M₈ off more completely to provide the desired minimum 0.5 volt hysteresis as required by specification (5) noted above.

Conversely when the input voltage $V_{IN}$ at 18 goes low corresponding to logic input "0" nearer to $V_{dd}$, the voltage at node N₃ corresponds to curve L₃ in FIG. 2 so that the transistor M₈ is turned on and current again flows in transistor M₇. The voltage at node N₄ goes toward $V_{ss}$ so that transistor M₁₃ is also turned off and the voltage at node N₇ also moves toward $V_{ss}$. That voltage at N₇ then turns off transistor M₁₂ and also turns off transistor M$_{16}$ so that the voltage at output 34 goes toward V$_{dd}$. As transistor M$_{12}$ is turned off, the current at node N$_5$ decreases and voltage at node N$_5$ decreases, The voltage at node N$_6$ also goes toward V$_{dd}$ and transistor M$_{11}$ stops conducting because there is no voltage across the transistor. As thus described, nodes N$_4$ and N$_6$ are both outputs from the Schmitt trigger. The inverted output from node N$_4$ is buffered through the source follower stage formed by transistors M$_{13}$ and M$_{14}$ and provides desired current gain while also cooperating with the noninverted output from node N$_6$ in operating the final output stage of the buffer 10 as formed by the transistors M$_{15}$ and M$_{16}$.

In that way the input buffer 10 accomplishes the desired results and meets the desired input buffer specification utilizing a limited number of PMOS transistors of relatively limited size.

It should be understood that although particular embodiments of the improved input buffer of this invention have been described above by way of illustrating the invention, this invention includes all modifications and equivalents of the disclosed embodiments falling within the scope of the appended claims.

I claim:

1. An input buffer comprising means responsive to logic input signals at selected voltage levels for providing corresponding control signals at level-shifted voltage levels, Schmitt trigger means responsive to said control signals for providing corresponding trigger output signals with selected hysteresis, and output means responsive to said trigger signals for providing buffer output signals having improved compatibility for driving selected circuit means, said level-shifting means comprising MOS transistor means forming voltage divider means for providing a reference voltage at a selected level, a pair of MOS transistor means forming a current mirror means, MOS transistor means biased by said reference voltage to provide desired current levels in one of said current mirror transistor means, and additional MOS transistor means responsive to said logic input signals and to said current mirror means for assuring said corresponding control signals are provided at desired level-shifted voltage levels.

2. An input buffer comprising means responsive to logic input signals at selected voltage levels for providing corresponding control signals at level-shifted voltage levels, Schmitt trigger means responsive to said control signals for providing corresponding trigger output signals with selected hysteresis, and output means responsive to said trigger signals for providing buffer output signals having improved compatibility for driving selected circuit means, said Schmitt trigger means having transistor means therein arranged to define selected voltage thresholds for the trigger means and having an additional transistor means connected between said first named transistor means and a system supply voltage to add dependence on the system supply voltage to the trigger thresholds so that the threshold voltages of the trigger means track said corresponding control signals furnished by the level-shifting means for providing said trigger output signals in response to control signals within the trigger thresholds during said supply voltage variations.

3. An MOS integrated circuit input buffer comprising PMOS integrated circuit means responsive to logic input signals provided at voltage levels corresponding to those provided by PMOS integrated circuit means for providing corresponding control signals at level-shifted voltage levels, PMOS integrated circuit means forming Schmitt trigger means responsive to said level-shifted control signals for providing corresponding trigger output signals with selected hysteresis, and PMOS integrated circuit output means responsive to said trigger signals for providing buffer output signals having improved compatibility for driving PMOS integrated circuit means, said level-shifting means comprising MOS transistor means forming voltage divider means for providing a reference voltage at a selected level, a pair of MOS transistor means forming a current mirror means, MOS transistor means biased by said reference voltage to provide desired current levels in one of said current mirror transistor means, and additional MOS transistor means responsive to said logic input signals and to said current mirror means for providing control signals corresponding to said logic input signals at level-shifted voltage levels.

4. An MOS integrated circuit input buffer as set forth in claim 3 wherein said Schmitt trigger means comprises a pair of MOS transistor means arranged in parallel and additional MOS transistor means arranged in first and alternate legs of the trigger means connected to said pair of parallel transistor means to define selected voltage thresholds for the trigger means and to be operable in response to said control signals within the trigger thresholds for providing corresponding trigger output signals with desired hysteresis, and has another MOS transistor means connected between said parallel transistor means and a system supply voltage to add dependence on the system supply voltage to the trigger thresholds for modifying the thresholds of the Schmitt trigger means to track said control signals during variations in said system supply voltage.

5. An MOS integrated circuit input buffer as set forth in claim 4 wherein said output means includes push-pull driver means and said PMOS integrated circuit means includes source follower means responsive to the signals provided by said above-named Schmitt trigger transistor means for providing the trigger output signals with improved current gain and improved propagations delay, said source follower means being arranged to cooperate in driving said Schmitt trigger means for achieving improved speed characteristics in the buffer.

6. An input buffer system comprising means responsive to logic input signals at selected voltage levels for providing corresponding control signals at level-shifted voltage levels, Schmitt trigger means responsive to said control signals for providing corresponding trigger output signals with selected hysteresis, and output means responsive to said trigger signals for providing buffer output signals having improved compatibility for driving selected circuit means, said output means including push-pull driver means and said system including source follower means responsive to the signals provided by said above-named Schmitt trigger means for providing the trigger output signals with improved current gain and improved propagation delay, said source follower means being arranged to cooperate in driving said Schmitt trigger means for achieving improved speed characteristics in the input buffer system.

* * * * *